United States Patent [19]

Mucke

[11] Patent Number: 5,307,026
[45] Date of Patent: Apr. 26, 1994

[54] VARIABLE GAIN RF AMPLIFIER WITH LINEAR GAIN CONTROL

[75] Inventor: Lars H. Mucke, San Diego, Calif.
[73] Assignee: Nokia Mobile Phones, Ltd., Finland
[21] Appl. No.: 989,117
[22] Filed: Dec. 11, 1992
[51] Int. Cl.[5] ............................................. H03G 3/30
[52] U.S. Cl. ................................... 330/283; 330/294
[58] Field of Search ..................... 330/86, 94, 95, 283, 330/294

[56] References Cited

U.S. PATENT DOCUMENTS

| | | | |
|---|---|---|---|
| 3,023,369 | 2/1962 | Horowitz | 330/283 |
| 3,942,181 | 3/1976 | Berrod et al. | 330/283 X |
| 4,583,050 | 4/1986 | Shinomiya | 330/283 |

*Primary Examiner*—James B. Mullins
*Attorney, Agent, or Firm*—Perman & Green

[57] ABSTRACT

The circuit amplifies an input RF band of signals and exhibits a signal gain in decibels that is a linear function of a logarithmic control signal input. The circuit employs a transistor having an emitter electrode connected through an inductor/resistor combination to a source of common potential. Within a limited band of RF frequencies, the resistor inductor combination appears to be a high impedance. A PIN diode is connected in shunt across the resistor/inductor combination and, in response to a control current, alters its RF resistance. A capacitor is connected across the emitter of the transistor and provides a tuning function so that, at the mid-frequency of the RF band, a resonant tuned circuit results, thereby causing a high value resistive load to appear across the PIN diode. In this manner, linear gain control is achieved by varying a DC control current through the PIN diode.

2 Claims, 2 Drawing Sheets $$\vec{Z}b = Rb + j(X,Cp)$$

$$GAIN = \frac{\vec{Z}c}{\dfrac{\vec{Z}b \cdot Rv}{\vec{Z}b + Rv} + \vec{Z}e}$$

$$Rp = \left(\frac{Z(Lb)}{Rb}\right)^2 \cdot Rb$$

$$\text{GAIN} = \frac{\vec{Z}c}{\frac{R(DI) \cdot Rp}{R(DI) + Rp} + \vec{Z}e}$$

$$\approx \frac{\vec{Z}c}{R(DI)}$$

VARIABLE GAIN RF AMPLIFIER WITH LINEAR GAIN CONTROL

FIELD OF THE INVENTION

This invention relates to radio frequency (RF) amplifiers and, more particularly, to a radio frequency amplifier exhibiting a linear gain control characteristic over a band of expected RF frequencies.

BACKGROUND OF THE INVENTION

Various gain control techniques are known for radio frequency and intermediate frequency amplifiers. As the use of portable communications equipment has increased (e.g., cellular telephones), it has become important to implement gain control techniques using a minimum of circuitry to reduce device cost and weight.

In certain applications, it is important to be able to predict the gain of an RF amplifier strictly through knowledge of a control signal. Gain, in such circuits, is generally expressed in decibels (dB) as follows:

$$\text{Gain} = (a)\log(\text{CONTROL}) + b \tag{1}$$

Where:
CONTROL is measured in volts or amperes; and a and b constants.

Linear gain control in such circuits has been implemented through the use of a multiplier that employs a differential transistor amplifier structure. Such an arrangement requires many matching transistors and is practical only when implemented as a monolithic integrated circuit. Others have implemented linear gain control by the use of a compensation circuit which, in response to a control signal, modifies the transfer characteristic of an RF amplifier so as to negate its nonlinearities. Such a circuit is shown in U.S. Pat. No. 5,099,204 to Wheatley, III.

A variety of prior art amplifiers employ PIN diodes for gain control. A PIN diode is a three layer device consisting of an intrinsic high resistance layer in the center, with conducting P and N layers on either side. The intrinsic layer's RF resistance can be controlled by a DC bias current and is approximately proportional to the inverse of the current:

$$R_{RF} = \frac{K}{I_{DC}^{\alpha}} \tag{2}$$

Where
K and $\alpha$ are constants; and $I_{DC}$ is the dc bias current

"Communications Receivers", Ulrich L. Rohde, T. T. N. Bucher, McGraw-Hill, 1988, pages 235–41 describe various applications of PIN diodes for amplifier gain control. In one version (page 237), a pair of PIN diodes controls the impedance of a common emitter circuit in an emitter coupled RF amplifier. In another version (page 239), three PIN diodes are employed as a variable attenuator between amplifier stages. In "Practical Variable Gain Amplifiers", Franklin, RF Expo West '92, pages 41–54, a number of PIN diode attenuators are shown used as variable gain controls for RF amplifiers. A number of diode attenuator topologies are disclosed, including series, shunt, Tee, bridge and bridge/Tee configurations. Similar configurations are employed in commercially available RF amplifiers, e.g., the AGC-330, Voltage-Controlled AGC Amplifier, marketed by Avantek, 481 Cottonwood Drive, Milpitas, Calif. 95035. The AGC-330 Amplifier employs a double-T arrangement wherein the PIN diodes are separated by a resistor in the signal feed path.

In all of the above noted gain control configurations, known PIN diode characteristics are employed to provide gain control functions for RF amplifiers without specific consideration of gain control linearity. They do not take into account the affect of complex impedances in the circuit that vary the gain control effect of the PIN diode (or diodes). Those impedances cause the gain of an amplifier to vary in other than in a linear fashion in response to an applied control voltage.

Accordingly, it is an object of this invention to provide a linear gain control circuit for an RF amplifier.

It is a further object of this invention to provide a linear gain control circuit that operates under conditions of complex impedance variations within a narrow band of applied RF frequencies.

It is another object of this invention to provide a linear gain control circuit for an IF amplifier that is both simple and requires no special matched devices.

SUMMARY OF THE INVENTION

The circuit amplifies an input RF band of signals and exhibits a signal gain in decibels that is a linear function of a logarithmic control signal input. The circuit employs a transistor having an emitter electrode connected through an inductor/resistor combination to a source of common potential. Within a limited band of RF frequencies, the resistor inductor combination appears to be a high impedance. A PIN diode is connected in shunt across the resistor/inductor combination and, in response to a control current, alters its RF resistance. A capacitor is connected across the emitter of the transistor and provides a tuning function so that, at the mid-frequency of the RF band, a resonant tuned circuit results, thereby causing a resistive load to appear across the PIN diode. In this manner, linear gain control is achieved by varying a DC control current through the PIN diode.

DETAILED DESCRIPTION OF THE INVENTION

This invention employs a prior art RF amplifier circuit with modifications that make it possible to achieve a linear gain control over a limited band of RF frequencies. As such, the circuit is most useful as an intermediate frequency (IF) variable gain amplifier in a radio transceiver.

Figure 1:
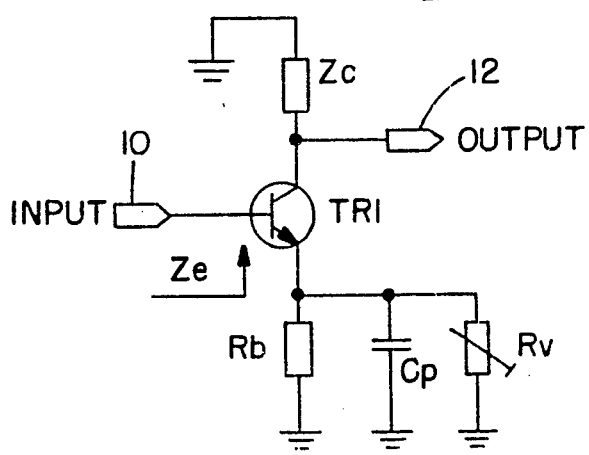
FIG. 1 is an equivalent circuit of a prior art RF amplifier employing shunt gain control.

In FIG. 1, a simplified AC version of the prior art circuit is shown. TR1 is a bi-polar transistor and its collector is connected through an impedance Zc to a power supply (not shown). Impedance Zc is complex at the RF frequencies applied to input node 10. Output from the circuit is taken at collector output node 12. Resistor Rb is connected between the emitter of TR1 and ground and is used to stabilize the emitter DC bias. Impedance Ze is the impedance seen looking into the emitter circuit of transistor TR1.

Capacitor Cp represents the stray capacitance of the circuit. Resistor Rv is a variable resistance that is used to vary the resistance at the emitter of transistor TR1, to thereby alter the gain characteristic of the circuit. In the prior art circuit, Rv has principally been implemented as a shunt field effect transistor connected between the emitter of TR1 and ground.

Zb is the combined complex impedance of the impedances of Rb and Cp as follows:

$$Zb = Rb + j(X_{cp})$$

The gain of the circuit can be expressed as approximately:

$$\text{Gain} = \frac{Zc}{\frac{(Zb)(Rv)}{Zb + Rv} + Ze}$$

The gain equation shows that the minimum gain of the circuit of FIG. 1 is limited to Zc/Zb when Rv is much greater than $|Zb|$. The maximum gain of the circuit is Zc/Ze when Rv equals zero. The maximum gain control range is therefore Zb/Ze.

Figure 2:
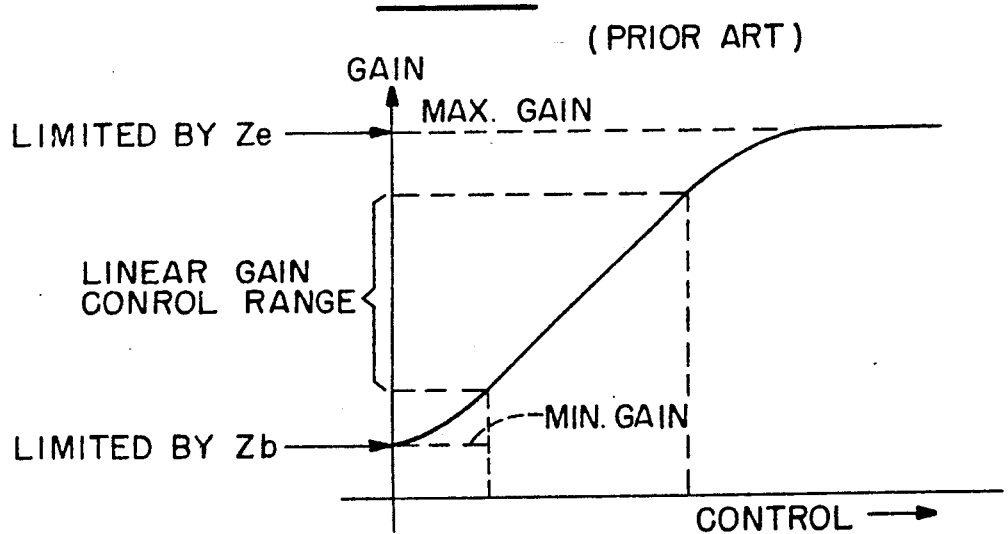
FIG. 2 is a plot of gain vs. control for the circuit of FIG. 1

A typical gain vs. control characteristic for the circuit of FIG. 1 is shown in FIG. 2. As can be seen from the characteristic, if the gain value of the circuit is set close to the gain control range limits (maximum or minimum gain), gain control becomes non linear. As can be seen:

$$\text{Maximum gain range} = \frac{Zb}{Ze} = \frac{\text{maxgain}}{\text{mingain}}$$

Thus, if Zb is made small, then the linear gain control range decreases to a point where the circuit may become impractical.

While the gain of the circuit can be increased by attempting to decrease Ze (impedance of the emitter diode), Ze can only be lowered to a level allowed by the maximum DC power dissipation for the circuit. The value of Zb may only be varied within tight limits because of the bias requirements at the emitter of TR1, which bias is set by the values of Rb and Cp.

Figure 3:
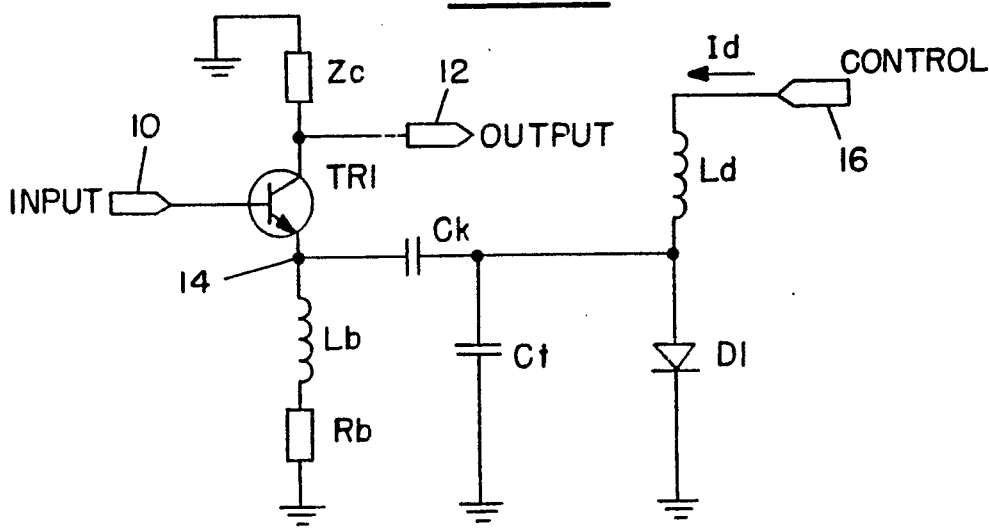
FIG. 3 shows a bi-polar circuit embodiment of the invention that employs shunt gain control.
Figure 4:
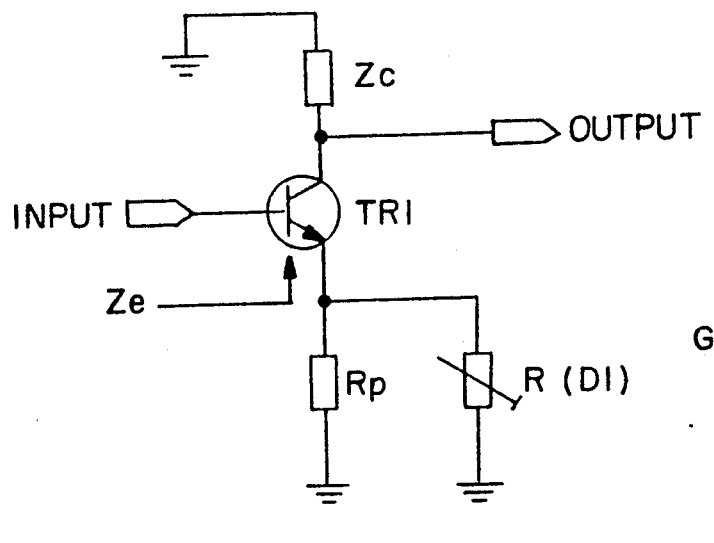
FIG. 4 is an AC equivalent of the circuit of FIG. 3.

As will be hereafter understood, the circuits shown in FIGS. 3 and 4 improve the linear gain circuit range by increasing Rb and thus increase the maximum gain range. In FIG. 3, the circuit of FIG. 1 has been modified by inserting an inductor Lb between emitter electrode of TR1 and resistor Rb. The size of inductor Lb is chosen so that it transforms the combined impedances of Lb and Rb to a high impedance "Rp" at the IF frequencies seen at node 14. Node 14 is further connected through a coupling capacitor Ck (which can be regarding as a short circuit at the IF operating frequencies) to a shunt capacitor Ct and to a node 16 between an inductor Ld and a PIN diode D1.

PIN diode D1, in the known manner, acts as a resistor with a linear resistance characteristic at high frequencies. By applying a DC control current Id, via control terminal 16, the RF resistance of PIN diode D1 can be varied accordingly. The resistance of PIN diode D1 is:

$$Rd = a/Id^b$$

where:
a and b are constants; and Id is the DC control current through PIN diode D1.

Inductor Ld provides RF isolation for control input 16 and coupling capacitor Ck separates the bias circuits of transistor TR1 and PIN diode D1 and, as above indicated, is essentially a short circuit at the IF bandwidth seen by the circuit. Capacitor Ck may be sized so as to tune out stray inductances that appear from the emitter of TR1, through diode D1 to ground thereby decreasing the effective value of Ze. Capacitor Ct, which includes the stray capacitances Cp (from FIG. 1) is employed to tune out the imaginary portions of the impedances of Lb and Ld.

As a result of the above described capacitances and inductances, a tuned circuit results having an equivalent that is shown in FIG. 4. The gain of the circuit of FIG. 4 may be expressed as follows:

$$\text{Gain} = \frac{Zc}{\frac{R(D1) \cdot Rp}{R(D1) + Rp} + Ze}$$

where:
R(D1) is the RF resistance of diode D1

The above equation indicates that the maximum gain range of the circuit (i.e. where Rp is much greater than R(D1)), is Rp/Ze. As the impedance of Lb is much larger than resistor Rb (see FIG. 3), Rp is much larger than Rb at the intermediate frequency. As a result, the gain control range is substantially increased over the range achieved by the circuit of FIG. 1.

This can be better understood by assuming values of 100 ohms for Rb and 3.3 microhenries for Lb. At 70 mHz, Lb is approximately 1451 ohms (reactive). The series Q of the circuit is $(2\pi)(Lb)(70 \text{ mHz})/Rb$. The Q is therefore 1451/100 = 14.51. Because the Q is much larger than 1, the following approximation can be used for the parallel resonant circuit comprising Lb, Rb and Ct:

$$Rp = Q^2 Rb = 14.5^2 (100) = 21.K \text{ ohms}$$

Thus, at a frequency of 70 mHz, the emitter impedance Rp is much greater than R(D1), as required.

If it is necessary to operate close to a maximum gain (i.e., Zc/Ze), the value of Rp may be chosen so that the slope of the gain control characteristic is the same at both minimum and maximum gain ranges. Rp will, in this manner, change the control slope at low gains in the same manner that Ze changes the slope at high gain levels. Thus, Rp acts as a linearizer. Even in this case, however, the value of Rp is higher Rb.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A circuit for amplifying a band of radio frequency (RF) signals, said circuit exhibiting a signal gain, in decibels (dB) that is a substantially linear function of a logarithmic control signal, said circuit comprising:

- a transistor having emitter, base and collector circuits, an output node connected to said collector circuit, said band of radio frequency signals applied to said base circuit;
- complex impedance means consisting of a series connected resistor/inductor combination connected between said emitter circuit and a source of common potential;
- a coupling capacitor connected to said emitter circuit;
- reactance means consisting of a shunt capacitor connected between said coupling capacitor and said source of common potential for providing, within said band of frequencies, a substantially resonant parallel circuit with said series connected resistor/inductor combination, and
- a PIN diode connected between said coupling capacitor and said source of common potential and responsive to said logarithmic control signal, to exhibit a shunt connected variable resistance within said band of frequencies, said variable resistance acting as a shunt to vary the RF emitter impedance of said circuit, and thus the RF gain of the circuit.

2. The circuit as recited in claim 1 wherein said substantially resonant parallel circuit exhibits an impedance that is substantially greater in value than the variable resistance of said PIN diode.

* * * * *